United States Patent
Huang et al.

(10) Patent No.: US 11,714,348 B2
(45) Date of Patent: Aug. 1, 2023

(54) APPARATUS FOR REMOVING A PELLICLE FRAME FROM A PHOTOMASK AND THE METHOD THEREOF

(71) Applicant: TAIWAN SEMICONDUCTOR MANUFACTURING COMPANY LTD., Hsinchu (TW)

(72) Inventors: Wei Cheng Huang, Hsinchu (TW); Kun-Lung Hsieh, Kaohsiung (TW)

(73) Assignee: TAIWAN SEMICONDUCTOR MANUFACTURING COMPANY LTD., Hsinchu (TW)

(*) Notice: Subject to any disclaimer, the term of this patent is extended or adjusted under 35 U.S.C. 154(b) by 0 days.

(21) Appl. No.: 17/810,859

(22) Filed: Jul. 6, 2022

(65) Prior Publication Data

US 2022/0334465 A1    Oct. 20, 2022

Related U.S. Application Data

(63) Continuation of application No. 17/122,933, filed on Dec. 15, 2020, now Pat. No. 11,392,025, which is a continuation of application No. 16/114,849, filed on Aug. 28, 2018, now Pat. No. 10,877,369.

(51) Int. Cl.
| | |
|---|---|
| *G03F 1/64* | (2012.01) |
| *G03F 1/82* | (2012.01) |
| *G03F 1/62* | (2012.01) |
| *G03F 7/20* | (2006.01) |
| *G03F 7/00* | (2006.01) |

(52) U.S. Cl.
CPC .................. *G03F 1/64* (2013.01); *G03F 1/62* (2013.01); *G03F 1/82* (2013.01); *G03F 7/70983* (2013.01)

(58) Field of Classification Search
CPC ..... G03F 1/62; G03F 1/64; G03F 1/82; G03F 7/70983
See application file for complete search history.

(56) References Cited

U.S. PATENT DOCUMENTS

| | | | |
|---|---|---|---|
| 7,598,074 B2* | 10/2009 | Hoshina | C02F 3/34 |
| | | | 210/615 |
| 10,527,956 B2* | 1/2020 | Coon | G03F 7/70008 |
| 2004/0252179 A1* | 12/2004 | Kraicer | G02B 27/0006 |
| | | | 250/237 R |

* cited by examiner

*Primary Examiner* — Christopher G Young
(74) *Attorney, Agent, or Firm* — WPAT Law; Anthony King

(57) ABSTRACT

An apparatus for removing a pellicle frame from a photomask includes a heater configured to soften an adhesive between the pellicle frame and the photomask; a shower head including a plate, a central region of the plate is configured to overlap with a pattern area of the photomask, and a periphery region of the plate is configured to provide a flow from the periphery region of the plate toward the pellicle frame and the adhesive; and a gripper configured to secure the pellicle frame against the flow and remove the adhesive and the pellicle frame from the photomask. A method of removing a pellicle frame, includes providing a plate overlapped with a pattern area of the photomask; providing a flow from the plate toward the pellicle frame and an adhesive; securing the pellicle frame; soften the adhesive; and leveraging the pellicle frame to remove the adhesive and the pellicle frame.

20 Claims, 9 Drawing Sheets

APPARATUS FOR REMOVING A PELLICLE FRAME FROM A PHOTOMASK AND THE METHOD THEREOF

PRIORITY CLAIM AND CROSS REFERENCE

This application is a continuation application of a U.S. patent application entitled APPARATUS FOR REMOVING A PELLICLE FRAME FROM A PHOTOMASK AND THE METHOD THEREOF, Ser. No. 17/122,933, filed on Dec. 15, 2020, which is a continuation application of a U.S. patent application entitled APPARATUS FOR REMOVING A PELLICLE FRAME FROM A PHOTOMASK AND THE METHOD THEREOF, Ser. No. 16/114,849, filed on Aug. 28, 2018, both of which are incorporated by reference in their entirety.

BACKGROUND

In the manufacturing of integrated circuit devices, photomasks, alternatively referred to as photoreticles or reticles, are used to project patterns for the integrated circuits on a semiconductor wafer. To protect the photomask from contamination, which can cause errors in the projected patterns, the photomask has been provided with a pellicle comprised of a pellicle frame and an optically transparent membrane. An adhesive is used to bond the pellicle frame to a surface of the photomask, and the membrane is stretched across the pellicle frame.

Reasons for removing the pellicle include repairing a defect detected in the photomask, removing haze contamination that has formed on the photomask under the pellicle, and replacing the pellicle due to mechanical damage or exposure damage. Haze contamination is a precipitant formed from chemical residue from the photomask cleaning, impurity of fab or environmental exposure. Currently, precipitated defects may be caused by airborne contamination from the environment, pellicle adhesive, photomask pod out-gassing, pellicle frame residue, chemical growth and deposition from the reactions, and mixing of chemical solutions.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
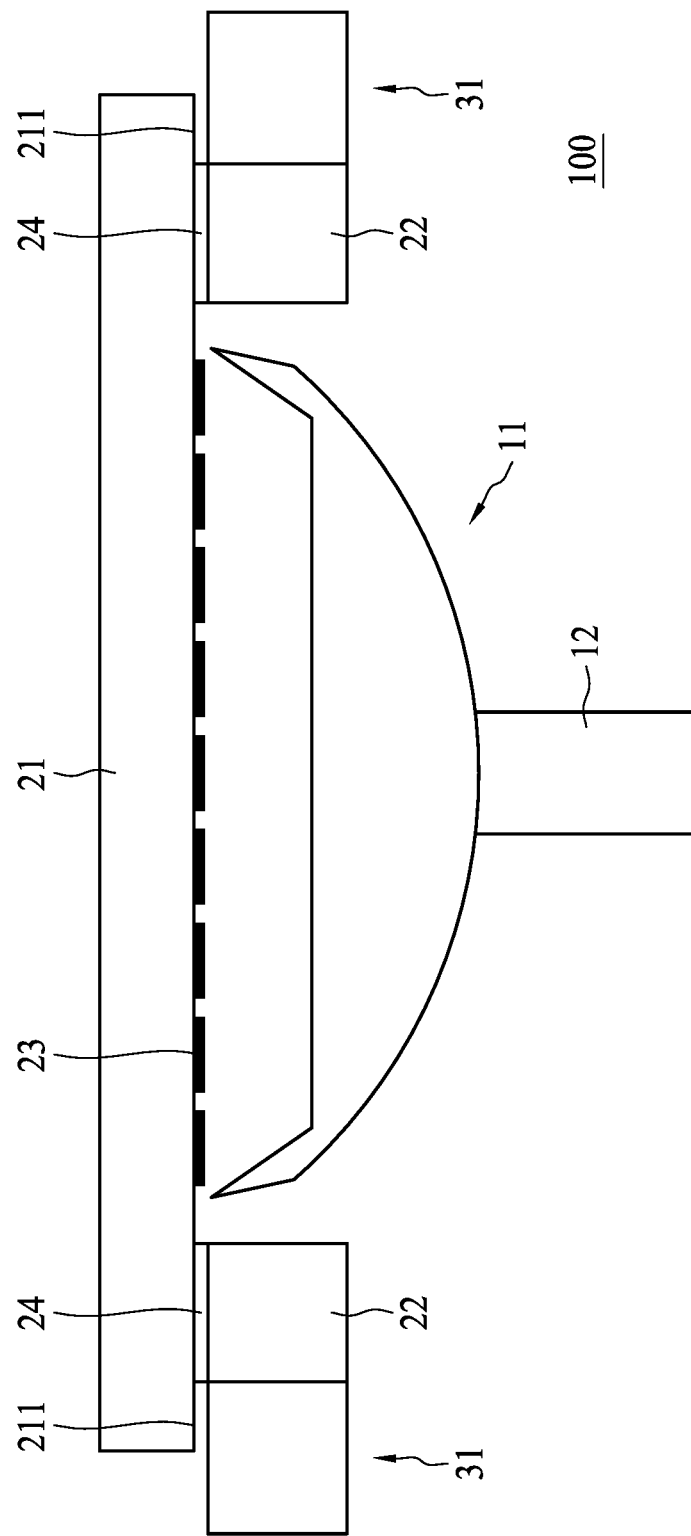
FIG. 1 is a schematic drawing illustrating an apparatus for removing a pellicle frame according to aspects of the present disclosure in one or more embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Typically, the method of removing the pellicle from the photomask includes applying mechanical force to the pellicle frame to separate the pellicle frame from the photomask. Problems are encountered with mechanical separation, however, including incomplete adhesive removal and pellicle adhesive deposited in the pattern area of the photomask, referred to as stringers, both requiring time-consuming cleaning which can degrade the photomask to the point of being unusable. Damage can also occur to the pattern on the photomask during mechanical separation, resulting in the photomask requiring costly repairs or needing to be replaced. Further, the abovementioned removal process has previously been carried out primarily only manually and fails to meet requirements.

The present disclosure therefore provides an apparatus for removing a pellicle frame from a photomask and a method of removing a pellicle frame from a photomask to reduce damage or contamination to the photomask. Consequently, during removal of the pellicle frame, a patterned area of the photomask may be fully prevented from contamination, and after removing the pellicle frame, there is no adhesive residue on the surface of the photomask. Further, the incorrect actions of the operators may be avoided by using automatic equipment. Accordingly, contamination and residue issues are mitigated and thus process yield is improved.

FIG. 1 is a cross-sectional view illustrating an apparatus 100 for removing a pellicle frame 22 from a photomask 21 according to aspects of the present disclosure in some embodiments. Referring to FIG. 1, the apparatus 100 includes a shower head 11 and a gripper 31. The shower head 11 is configured to provide an air curtain (not shown) between the pellicle frame 22 and a patterned area 23 of the photomask 21. The gripper 31 is configured to secure the pellicle frame 22 from a direction against the flow blown from the air curtain, wherein the flow is substantially directed toward a periphery 211 of the photomask 21. In some embodiments, the pellicle frame 22 is affixed to one side of the photomask 22 by an adhesive 24 bond between the pellicle frame 22 and the photomask 21. In some embodiments, the patterned area 23 is surrounded by the pellicle frame 22. In some embodiments, the photomask 21 is held in the apparatus 100 with the patterned area 23 facing toward a direction along the gravity force.

In some embodiments, the shower head 11 is not in contact with the photomask 21, so as not to damage the photomask 21. In some embodiments, the shower head is driven by a first driver 12 and is vertically adjustable in relation to the photomask 21 in order to control the distance between the photomask 21 and the shower head 11 and to ensure the shower head 11 does not touch the patterned area 23. In some embodiments, the first driver 12 is automatic equipment that may precisely adjust the distance between the shower head 11 and the photomask 21. Compared with the current manual adjustment, when the shower head 11 is adjusted by automatic equipment, such as the first driver 12, not only is the photomask 21 protected from further contamination or damage, but the adjustment of the relative position of the shower head 11 and the photomask 21 is more accurate, and the adjustment can be reproducible.

Figure 2:
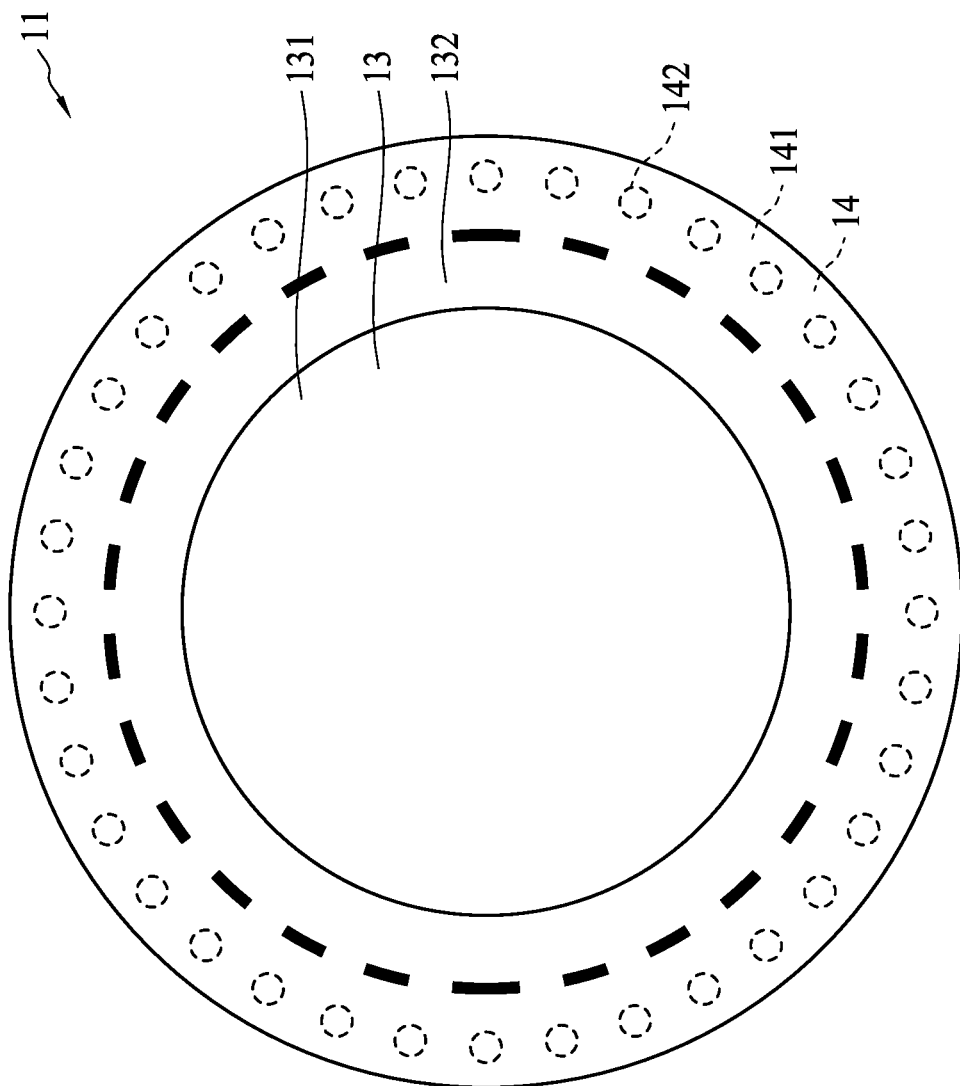
FIG. 2 illustrates a shower head in accordance with embodiments of the present disclosure.
Figure 3:
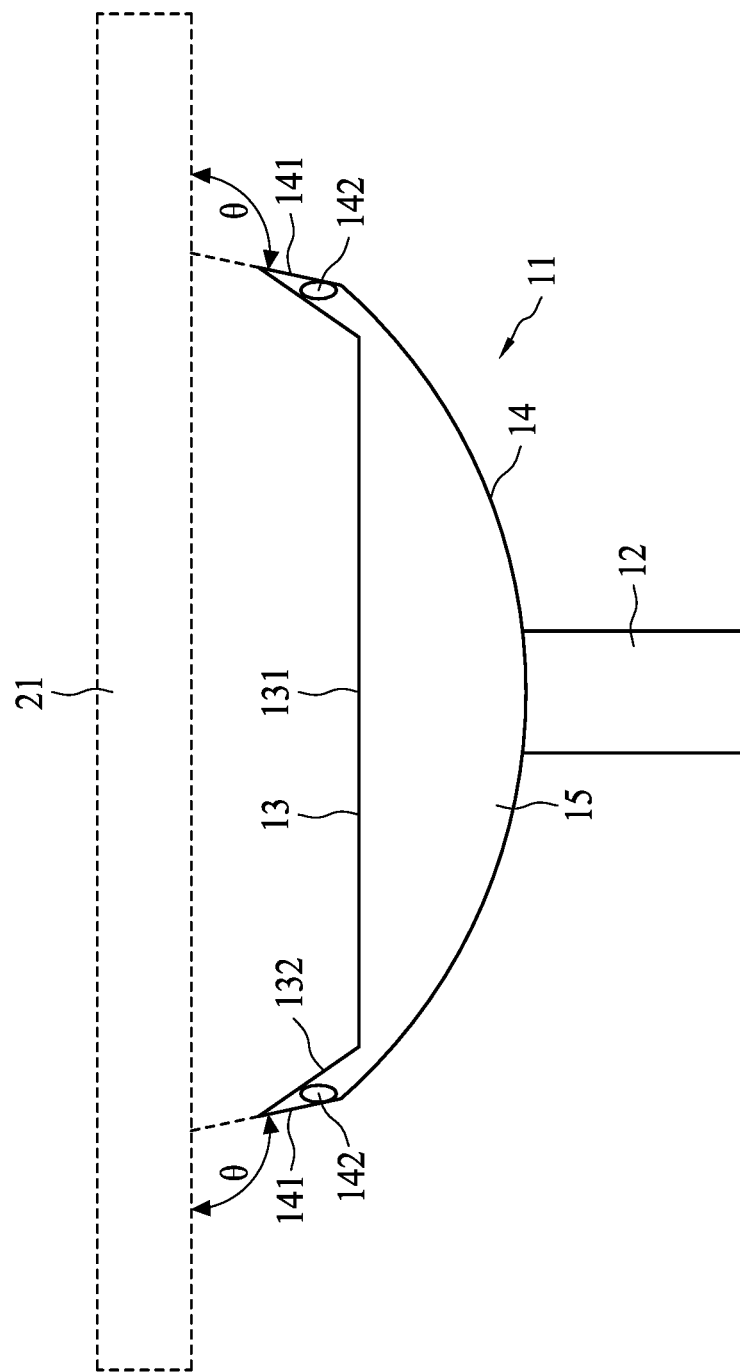
FIG. 3 illustrates a shower head in accordance with embodiments of the present disclosure.

Please refer to FIGS. 2 and 3, wherein FIG. 2 is a bottom view of the shower head 11 and FIG. 3 is a side view of the shower head 11 in aspects of the present disclosure in one or more embodiments. The shower head 11 includes a cover 14 and plate 13 joined together. An accommodation space 15 is formed by the cover 14 and plate 13. The plate 13 includes a central region 131 and a peripheral region 132 defined thereon. In other words, the peripheral region 132 is defined between the central region 131 of the plate 13 and the cover 14. The cover 14 includes a circumferential wall 141 connected to the peripheral region 132 of the plate 13. The plate 13 can be, but need not necessarily be, round, oval, rectangular, square or other desired shape corresponding to the patterned area 23 of the photomask 21, which the pellicle frame 22 surrounds. The cover 14 can be, but need not necessarily be, round, oval, rectangular, square or other desired shape corresponding to the plate 13. As shown in FIG. 2, the central region 131 can include a round shape while the peripheral region 132 includes a ring shape encircling the central region 131. A plurality of gas outlets 142 is disposed on the circumferential wall 141 of the cover 14. As shown in FIG. 3, a plurality of gas outlets 142 is disposed in the circumferential wall 141 of the cover 14. In some embodiments, the gas outlets 142 are configured to provide the air curtain (not shown) by blowing a flow directly toward the periphery 211 of the photomask 21. In some embodiments, the gas outlets 142 are arranged in concentric circles, but the disclosure is not limited thereto. In some embodiments, each of the gas outlets 142 has a same shape and a same pore diameter, but the disclosure is not limited thereto. In some embodiments, a distance between any two neighboring gas outlets 142 can be, for example but not limited to, consistent.

In some embodiments, the circumferential wall 141 is oriented at an angle $\theta$ in relation to the photomask 21 so that the flow blown from the gas outlets 142 is substantially directed toward the periphery 211 of the photomask 21. Due to the angle $\theta$ of the circumferential wall 141, the flow blown from the air curtain is substantially directed toward the periphery 211 of the photomask 21, dust, contaminants and any by-products produced during the removal of the pellicle frame 22 will be blown away from the patterned area 23, and the patterned area 23 may not be contaminated. In some embodiments, the angle $\theta$ ranges from 90° to 180°.

In some embodiments, the flow is allowed to blow through the gas outlets 142, thereby providing the air curtain between the pellicle frame 22 and the patterned area 23. The air curtain cooperates with the shower head 11 to prevent dust or contaminants from entering the patterned area 23 during operation. In some embodiments, the flow creates positive pressure from the patterned area 23 toward the pellicle frame 22 and the adhesive 24. In some embodiments, the air curtain is formed with nitrogen gas, oxygen gas, or argon. In some embodiments, the air curtain is formed with nitrogen gas. In some embodiments, the purity of the nitrogen gas is 99.999%. In some embodiments, the shower head 11 further connects to a gas supply through various apparatuses such as gas tube, pressure regulators, valves, mass flow controllers, or other flow controllers, manifolds, and/or regulators. In some embodiments, the gas supply can be integrated with the shower head 11.

Figure 4:
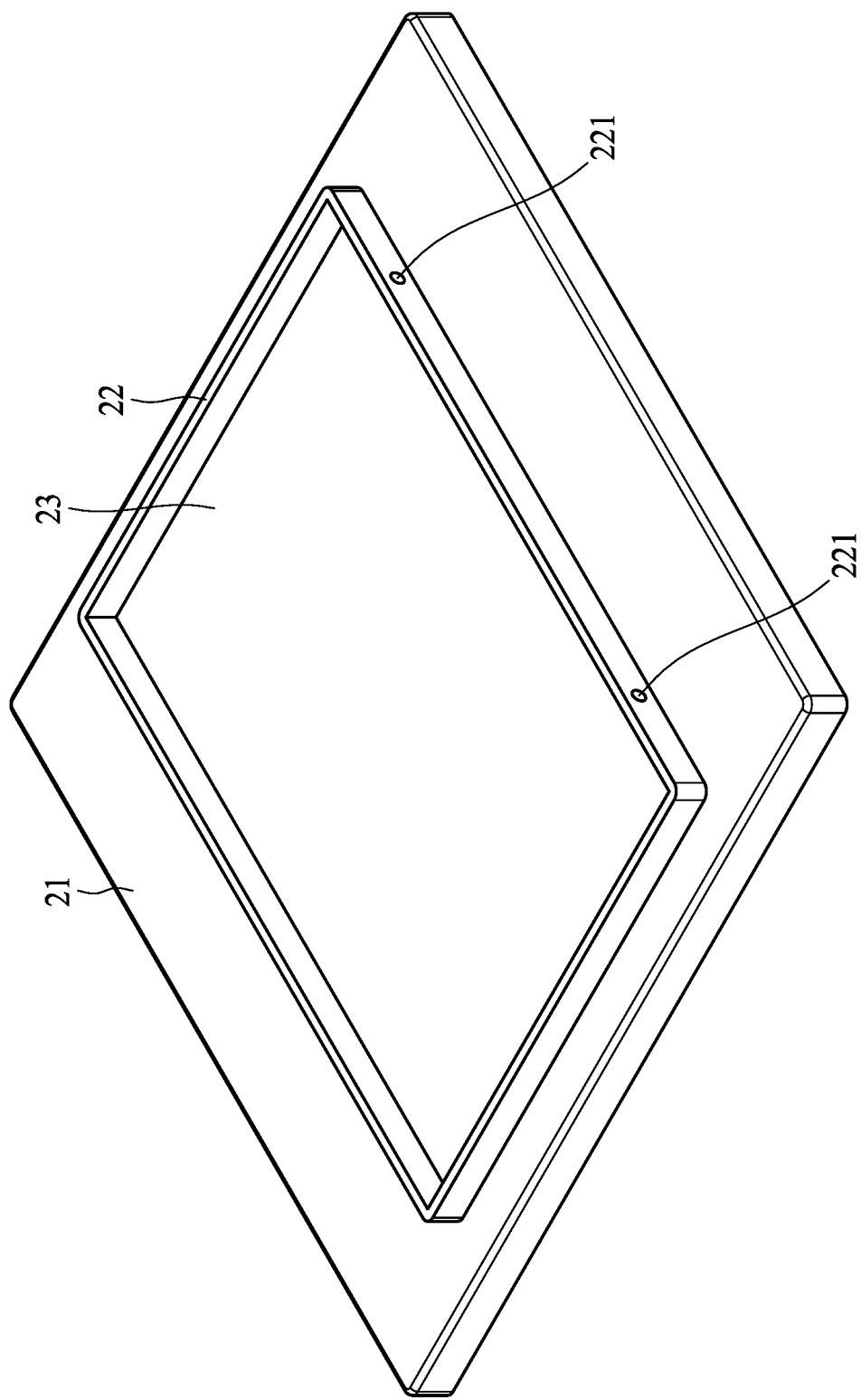
FIG. 4 is a schematic drawing illustrating a photomask and a pellicle frame in accordance with embodiments of the present disclosure.
Figure 5:
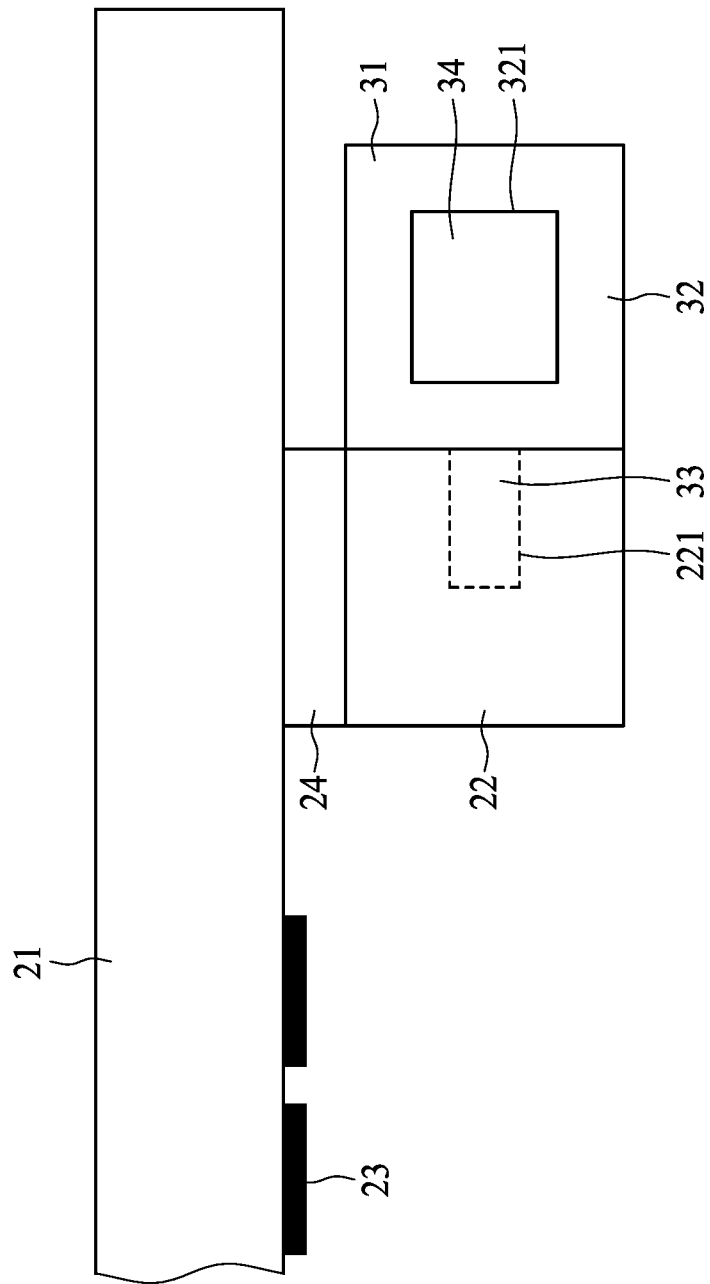
FIG. 5 illustrates a partial schematic in accordance with embodiments of the present disclosure.

Please refer to FIGS. 4 and 5, wherein FIG. 4 is a schematic drawing of the photomask 11 and the pellicle frame 12 and FIG. 5 is a schematic drawing of the gripper 31 in aspects of the present disclosure in one or more embodiments. For the purpose of removing the pellicle frame 22 from a photomask 21, a secure fixing of the pellicle frame 22 during operation is desired. The gripper 31 is configured to secure the pellicle frame 22 in a force-transmitting and shape-matched manner from a direction against the flow blown from the air curtain. In some embodiments, the pellicle frame 22 can be held at two oppositely disposed sides by means of two grippers 31.

As shown in FIG. 4, in some embodiments, the pellicle frame 22 typically ranges from about 3 mm in height to about 6.35 mm in height. Heights of other typical pellicle frames 22 are about 3.15, 4, 5, or 6 mm. In some embodiments, the design of the gripper 31 can be used to match the pellicle frame 22 of any height. The geometrical design and dimension of the pellicle frame 22 has no particular limits, and can be, but need not necessarily be, round, oval, rectangular, square or other desired shape. In some embodiments, mounts 221 are provided at the radially outer edge of the pellicle frame 22 in the form of blind holes. The mounts 221 can be arranged at different positions depending on the geometrical design and dimension of the pellicle frame 22. In some embodiments, the pellicle frame 22 which is generally rectangular in shape, four mounts 221 are provided at the radially outer edge of the two long sides of the pellicle frame 22, each of the long sides of the pellicle frame 22 has a pair of the mounts 221. In some embodiments, the pellicle frame 22 which is generally rectangular in shape, four mounts 221 are provided at the radially outer edge of the two short sides of the pellicle frame 22, each of the short sides of the pellicle frame 22 has a pair of the mounts 221.

As shown in FIG. 5, in some embodiments, the gripper 31 includes a support arm 32 and at least one lift pin 33 protruding from the support arm 32 for engaging and lifting the pellicle frame 22. In some embodiments, the support arm 32 has an inner channel 321 for accommodating a coolant 34. In some embodiments, the support arm 32 may be pressed against the pellicle frame 22 and allow thermal transfer cooling of the pellicle frame 22 and a portion of the adhesive 24. In some embodiments, the support arm 32 is made from a material having high heat transfer rate and low coefficient of thermal expansion to increase the transfer of heat from the pellicle frame 22 to the coolant 34 while maintaining sufficient strength to secure the pellicle frame 22. In some embodiments, the support arm 32 is made from titanium, iron-nickel alloy or stainless steel.

The number of the support arm 32 has no particular limits, and can be arranged depending on the geometrical design and dimension of the pellicle frame 22. In some embodiments, the gripper 31 has two support arms 32. In some embodiments, the pellicle frame 22 which is generally rectangular in shape is secured on two opposite sides by the support arms 32. In some embodiments, two support arms 32 are fixed to the two long sides of the pellicle frame 22. In some embodiments, two support arms 32 are fixed to the two short sides of the pellicle frame 22.

In some embodiments, the gripper 31 has four support arms 32. In some embodiments, the pellicle frame 22 is generally rectangular in shape, and the pellicle frame 22 is engaged on each of the four sides of the pellicle frame 22 by four support arms 32. In some embodiments, four support arms 32 are separated. The use of separated support arms 32 allows the apparatus 100 to accommodate various shapes and sizes of pellicle frames 22.

It is desirable that the coolant 34 utilized maintains the temperature of a portion of the adhesive 24 attached to the pellicle frame 22 sufficiently that the portion of the adhesive 24 remains solid and firm. In some embodiments, the coolant 34 is water. However, any other suitable coolant 34 may be used, including liquid nitrogen, argon, oxygen, hydrogen, helium, fluorine, methane, neon, carbon monoxide, and the combinations thereof. In some embodiments, the support arm 32 containing the coolant 34 is placed in contact with the pellicle frame 22 for a period of time. The amount of time for which the pellicle frame 22 and the adhesive 24 are cooled will be affected by the type of the coolant 34, the gripper 31, and the adhesive 24. In some embodiments, reducing the time of removing the pellicle frame 22 from the photomask 21 is achieved by maximizing the contact between the support arm 32 with the pellicle frame 22. In some embodiments, weep holes (not shown) are further provided in the support arm 32 to allow the coolant 34 closer to the pellicle frame 22 to accelerate cooling.

The lift pin 33 functions for inserting into the mount 221 of the pellicle frame 22. In some embodiments, the gripper 31 is driven by a second driver and is vertically adjustable to vertically remove the pellicle frame 22 from the photomask 21 and horizontal adjustable to press against the radially outer edge of the pellicle frame 22. In some embodiments, the second driver (not shown) is automatic equipment which may be precisely secured to the pellicle frame 22. Compared with the current manual adjustment, when the gripper 31 is adjusted by automatic equipment, the relative position of the pellicle frame 22 and the gripper 31 can be adjusted accurately and can be reproducible. When the second driver (not shown) vertically adjusts the gripper 31 to move away from the photomask 21, the pellicle frame 22 may be leveraged by the lift pin 33. It should be noted that the configuration of the lift pin 33 must correspond to the mount 221 of the pellicle frame 22.

Figure 6:
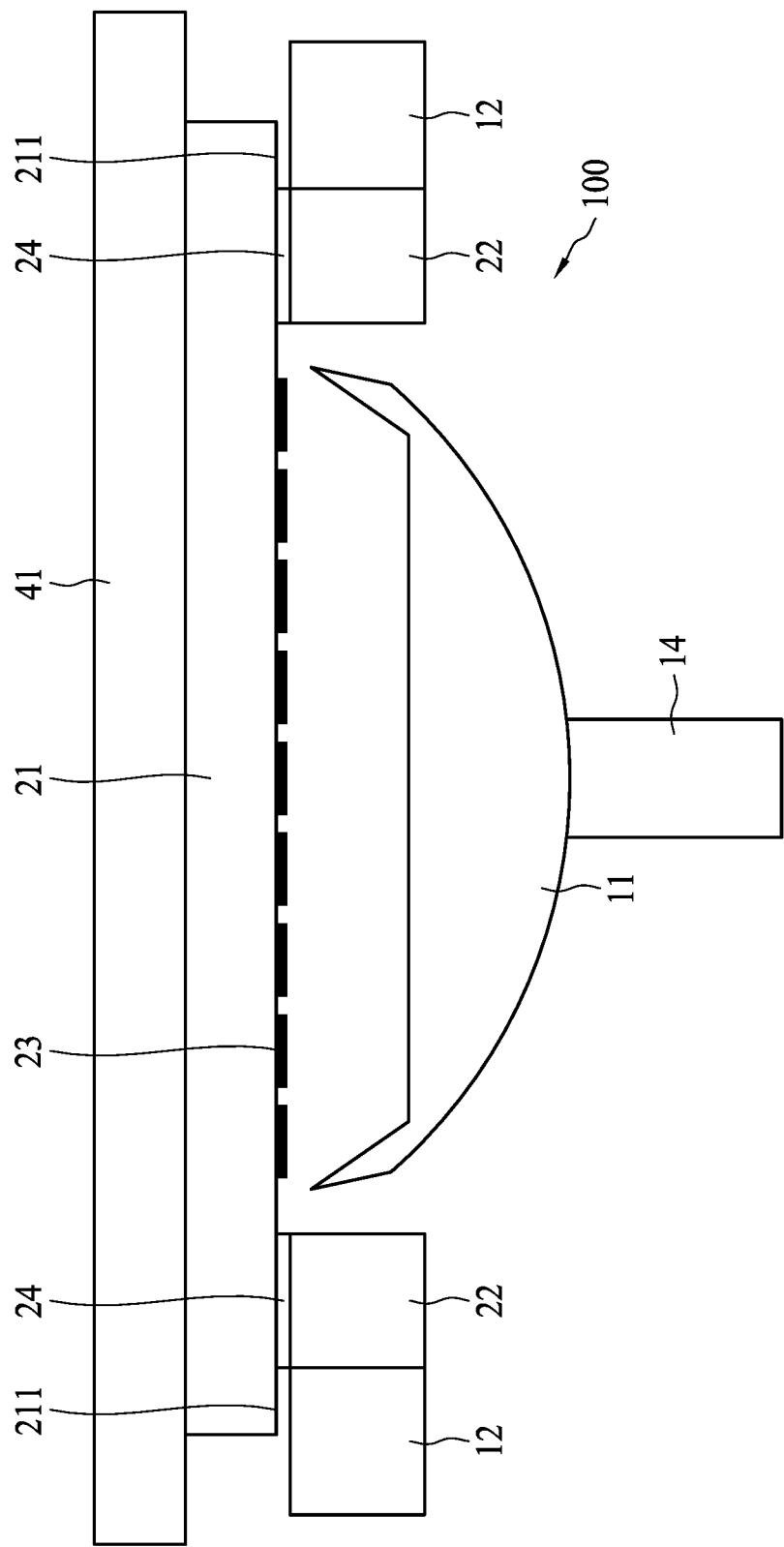
FIG. 6 is a schematic drawing illustrating an apparatus for removing a pellicle frame according to aspects of the present disclosure in one or more embodiments.

FIG. 6 is a schematic drawing illustrating the apparatus 100 according to aspects of the present disclosure in some embodiments. Referring to FIG. 6, in some embodiments, the apparatus 100 further includes a heater 41 configured to heat the photomask 21 to an elevated temperature in order to soften a portion of the adhesive 24 and to facilitate the complete separation of the pellicle frame 22 and the adhesive 24 from the photomask 21. The arrangement or type of the heater 41 is not particularly limited as long as the adhesive 24 at the interface between the photomask 21 and the adhesive 24 can be softened. In some embodiments, the heater 41 is attached to the photomask 21. In some embodiments, the heater 41 is disposed on a surface of the photomask 21 opposite to the patterned area 23. In some embodiments, the elevation temperature is adjusted according to the material of the adhesive. In some embodiments, the heater 41 is attached to the photomask 21 for a period of time. The time may be impacted by the type of heater 41, the photomask 21 and the adhesive 24.

Figure 7:
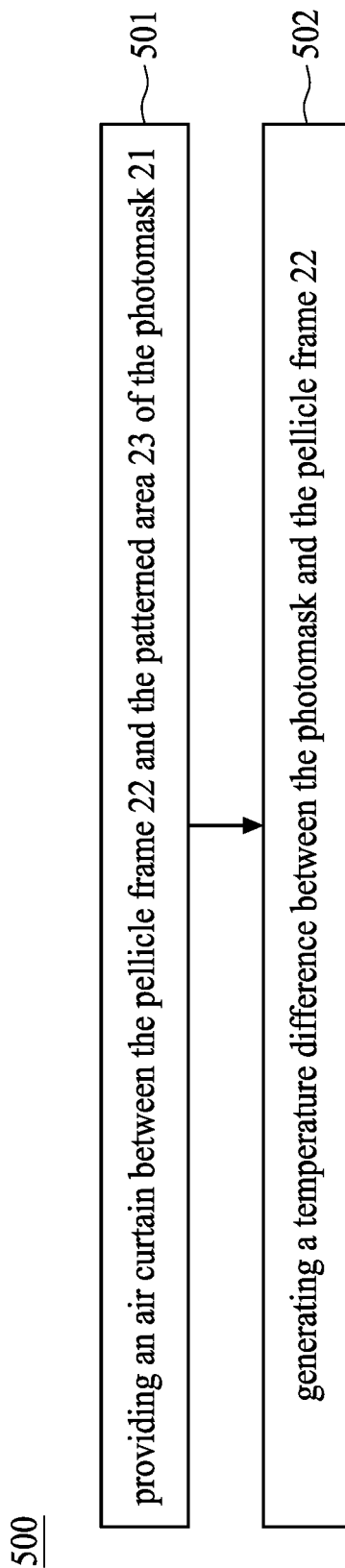
FIG. 7 shows a flowchart representing a method for removing a pellicle frame from a photomask according to aspects of the present disclosure in one or more embodiments.
Figure 8:
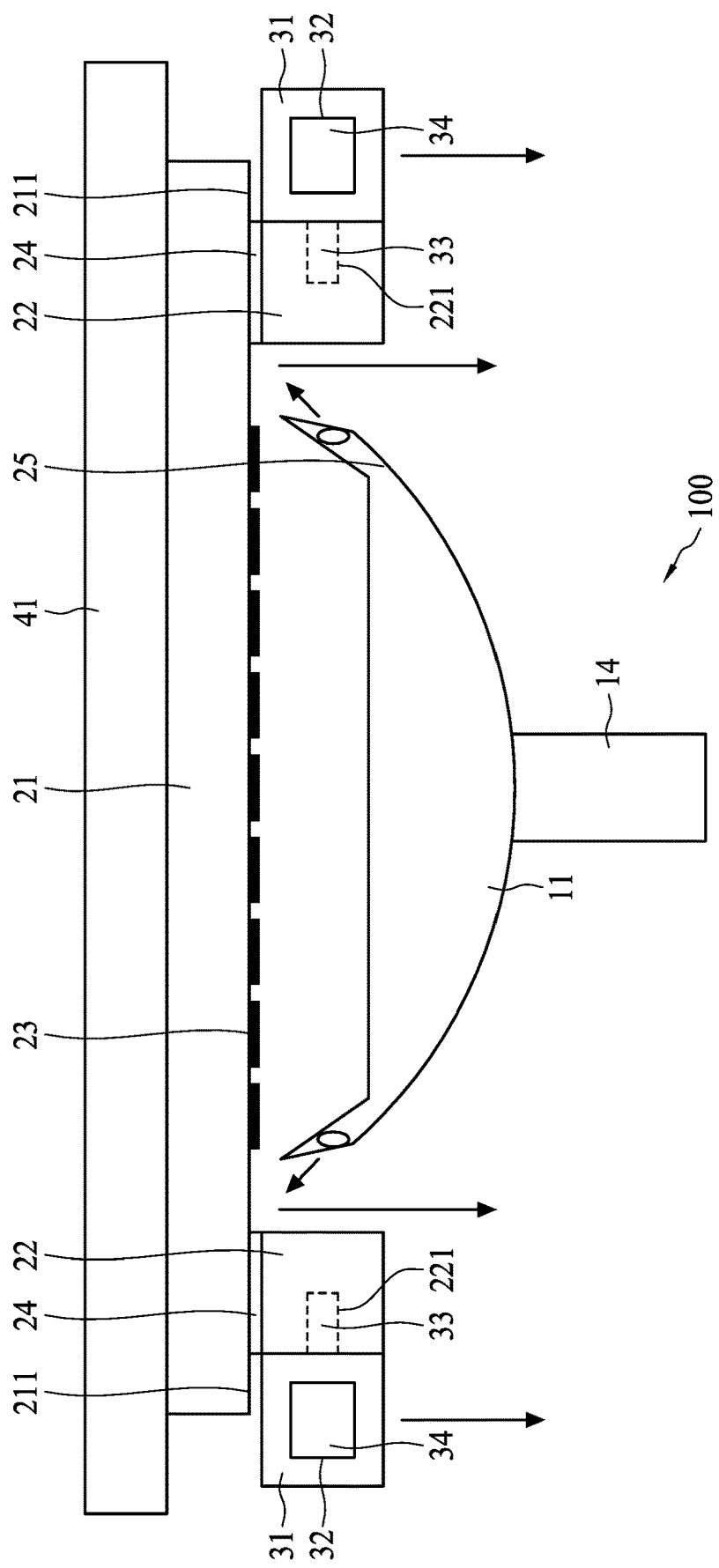
FIG. 8 is a schematic drawing illustrating an apparatus for removing a pellicle frame according to aspects of the present disclosure in one or more embodiments.
Figure 9:
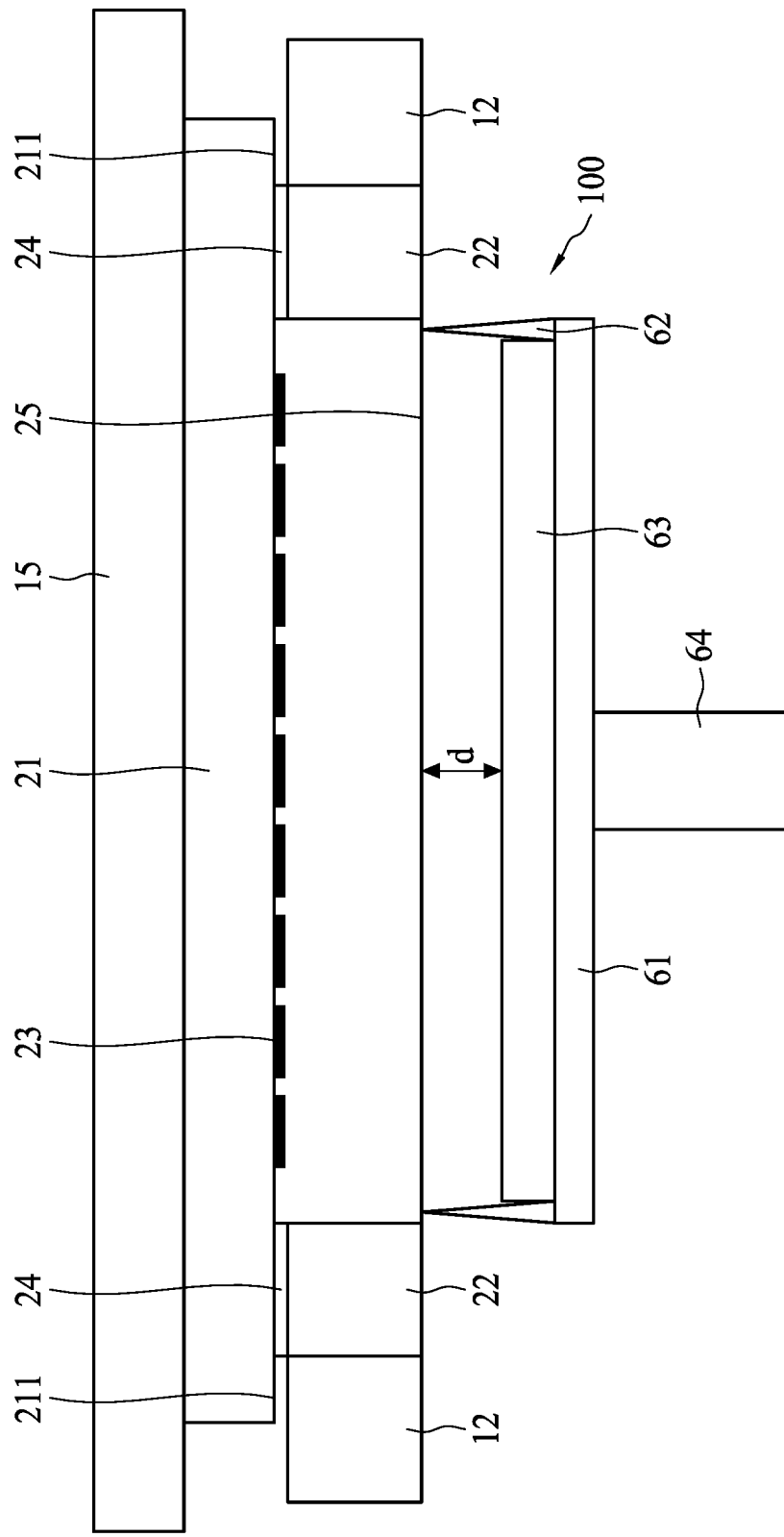
FIG. 9 is a schematic drawing illustrating an apparatus for removing a pellicle frame according to aspects of the present disclosure in one or more embodiments.

Please refer to FIGS. 7 and 8. FIG. 7 shows a flowchart representing a method of removing a pellicle frame 22 from a photomask 21 according to aspects of the present disclosure, and FIG. 8 is a schematic drawing of the apparatus in operation according to aspects of the present disclosure in one or more embodiments. In the present disclosure, a method of removing a pellicle frame 22 from a photomask 500 is also disclosed. In some embodiments, a pellicle frame 22 may be removed from the photomask 21 by the method 500. The method 500 includes a number of operations and the description and illustration are not deemed as a limitation as the sequence of the operations. The method 500 includes a number of operations 501, 502 as shown in FIG. 7.

The method 500 includes providing an air curtain between the pellicle frame 22 and the patterned area 23 of the photomask 21, and generating a temperature difference between the photomask 21 and the pellicle frame 22. In operation 501, the flow of air curtain blow from the shower head 11 is substantially directed toward a periphery 211 of the photomask 21 as shown in FIG. 8, in order to fully protect the patterned area 23 of the photomask 21 from contamination. In operation 502, when the heater 41 heats the photomask 21 to the elevation temperature and the pellicle frame 22 is cooled by the support arm 32 of the gripper 31, the temperature difference is provided between the pellicle frame 22 and the photomask 21. In some embodiments, the temperature difference causes a portion of the adhesive 24 bonded to the photomask 21 to soften, and the rest of the adhesive 24 remains firm, so that the pellicle frame 22 and adhesive 24 can be detached from the photomask 21 by mechanical force leaving little or no residue. In some embodiments, when the gripper 31 is secured to the pellicle frame 22, and when the lift pin 33 of the gripper 31 is engaged in the mount 221 of the pellicle frame 22, the pellicle frame 22 and the adhesive 24 attached thereon are removed vertically from the photomask 21 by vertically adjusting the gripper 31. In some embodiments, a plurality of gripper 31 are removed vertically from the photomask 21 at the same time, all of the lift pins 33 are raised simultaneously, thereby maintaining the pellicle frame 22 in a substantially horizontal position throughout the lifting operation and separating all portions of the pellicle frame 22 and the adhesive from the photomask 21 at the same time.

It should be noted that the air curtain is continuously supplied during the removal of the pellicle frame 22 and the adhesive 24, such that any material that may contaminate the pattern area 23 will be blown toward the periphery 211 of the photomask 21 by the flow of the air curtain. Further, after removing the pellicle frame 22, there is no adhesive residue on the surface of the photomask 21.

In some embodiments, the shower head 11 is adjusted by a first driver 12, and the gripper 31 is driven by a second driver. In some embodiments, the drivers are automatic equipment which may be accurately adjust the relative position between components and can precisely move the components, making the method of operation reproducible.

In some embodiments, after the detachment of the pellicle frame 22 from the photomask 21, the pellicle frame 22 and the photomask 21 can be transported separately. Subsequently to this, the photomask 21 does not need to be specially cleaned or repaired. In some embodiments, after the detachment of the pellicle frame 22 from the photomask 21, the photomask 21 can again be provided with a pellicle frame 22 and then inserted again.

In some embodiments, a membrane that is stretched across the pellicle frame 22 is removed prior to removing the pellicle frame 22. In some embodiments, the material of the film is not particularly limited.

FIG. 8 is a cross-sectional view illustrating the apparatus 100 according to aspects of the present disclosure in some embodiments. Referring to FIG. 8, in some embodiments, the apparatus 100 further includes a cutter 61 for removing the membrane 25. In some embodiments, the cutter 61 includes a blade 62 configured to cut the membrane 25 and a vacuum pad 63 configured to suck the cut membrane 25. In some embodiments, the blade 62 extends to the radially inner edge of the pellicle frame 22. In some embodiments, the vacuum pad 63 provides a vacuum suction to move the cut membrane 25 away from the pattern area 23 without contaminating the pattern area 23. In some embodiments, the membrane 25 can be immediately sucked by the vacuum pad 63 once it has been cut by the blade 62.

In some embodiments, the blade 62 can be, but need not necessarily be, a long strip of blade bent into a round, oval, rectangular, square or other desired shape corresponding to the inner edge of the pellicle frame 22. In some embodiments, the cutter 61 includes a plurality of blades 62, those blades 62 are not limited to being arranged in a round, oval, rectangular, square or other desired shape corresponding to the inner edge of the pellicle frame 22. In some embodiments, vacuum pad 63 is surrounded by the blade 62, and the number of the vacuum pad 63 is not particularly limited.

In some embodiments, the cutter 61 is driven by a third driver 64 and is vertically adjustable. In some embodiments, the third driver 64 provides sufficient strength causing the blade 62 to cut the membrane 25 along the inner edge of the pellicle frame 12. Ones the membrane 25 is cut, the cut membrane 25 will be sucked by the vacuum pad 63. In some embodiments, the third driver 64 is automatic equipment which may precisely approach the membrane 25 at a predetermined speed and evenly cut the membrane 25. Compared with the current manual adjustment, when the cutter 61 is adjusted by automatic equipment, the relative positions of the membrane 25 and the cutter 61 can be adjusted accurately, can be reproducible, and can evenly apply mechanical force to the membrane 25 until the membrane 25 is cut. In some embodiments, the predetermined speed is adjusted according to the material of the membrane 25 to avoid membrane fragmentation. In some embodiments, the predetermined speed is less when the membrane 25 is soft and faster when the membrane 25 is hard. In some embodiments, when the cutter 61 is moved to a position where the blade 62 just touches the membrane 25, the distance d between the vacuum pad 63 and the membrane 25 is 1 mm. By precisely controlling the distance d, once the membrane 25 is cut by the blade 62, it can be immediately sucked by the vacuum pad 63 without contaminating the patterned area 23.

In some embodiments, the pellicle frame 22 located around the patterned surface 23 of the photomask 21 faces toward a direction along the gravity force, and the cutter is located below the membrane 25. In some embodiments, ones the membrane 25 is cut, the cut membrane 25 falls onto the vacuum pad 63 due to gravity and is sucked by the vacuum pad 63, and does not stick to the pattern area 23 to cause contamination.

Accordingly, the present disclosure therefore provides an apparatus for removing a pellicle frame from a photomask and a method of removing a pellicle frame from a photomask. Consequently, the pellicle frame 22 and the adhesive 24 can be completely removed without contaminating the photomask 21, and the lifetime of the photomask 21 has significantly increased.

In some embodiments, an apparatus for removing a pellicle frame from a photomask is provided. The apparatus includes a shower head configured to provide an air curtain between the pellicle frame and a patterned area of the photomask, and a gripper configured to secure the pellicle frame from a direction against the flow blown from the air curtain. In some embodiments, the flow is substantially directed toward a periphery of the photomask.

In some embodiments, a method of removing a pellicle frame from a photomask is provided. The method includes providing an air curtain between the pellicle frame and a patterned area of the photomask, and generating a temperature difference between the photomask and the pellicle frame. In some embodiments, the flow of the air curtain is substantially directed toward a periphery of the photomask. In some embodiments, the temperature of the photomask is higher than the temperature of the pellicle frame.

In some embodiments, another method of removing a pellicle frame from a photomask is provided. The method includes cutting a membrane stretched across the pellicle frame to expose a patterned area of the photomask, providing an air curtain between the pellicle frame and the patterned area of the photomask, and generating a temperature difference between the photomask and the pellicle frame. In some embodiments, the flow of air curtain is substantially directed toward a periphery of the photomask. In some embodiments, the temperature of the photomask is higher than the temperature of the pellicle frame.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An apparatus for removing a pellicle frame from a photomask, comprising:
   a heater configured to soften at least a portion of an adhesive between the pellicle frame and the photomask;
   a shower head including a plate facing the heater, a central region of the plate is configured to overlap with a pattern area of the photomask from a top view prospective, and a periphery region of the plate surrounding the central region is configured to provide a flow from the periphery region of the plate toward the pellicle frame and the adhesive; and
   a gripper configured to secure the pellicle frame against the flow and to remove the adhesive and the pellicle frame away from the photomask.

2. The apparatus of claim 1, wherein the gripper has an inner channel for accommodating a coolant.

3. The apparatus of claim 1, wherein the gripper further includes a lift pin for engaging and lifting the pellicle frame, and includes a support arm and the lift pin protrudes from the support arm.

4. The apparatus of claim 1, wherein the flow includes nitrogen gas.

5. The apparatus of claim 1, wherein the shower head includes a cover joined with the plate, an accommodation space is formed by the plate and the cover, the peripheral region is defined between the central region and the cover, the cover includes a circumferential wall connected to the peripheral region of the plate, and a plurality of gas outlets are disposed on the circumferential wall of the cover.

6. The apparatus of claim 1, wherein the heater is disposed on a surface of the photomask opposite to the patterned area.

7. The apparatus of claim 1, further comprising a cutter configured to cut a membrane stretched across the pellicle frame in order to expose the patterned area of the photomask.

8. The apparatus of claim 7, wherein the cutter further includes a blade configured to cut the membrane and a vacuum pad configured to suck the membrane.

9. The apparatus of claim 1, wherein the shower head is driven by a first driver and is vertically adjustable in relation to the photomask, and the gripper is driven by a second driver and is vertically adjustable to vertically remove the pellicle frame from the photomask and horizontally adjustable to press against the pellicle frame.

10. The apparatus of claim 7, wherein the cutter is driven by a third driver and is vertically adjustable in relation to the membrane.

11. A method of removing a pellicle frame from a photomask, comprising:
    providing a plate adjacent to the pellicle frame, wherein the plate is overlapped with a pattern area of the photomask from a top view prospective and separated from the photomask;
    providing a flow from a peripheral of the plate toward the pellicle frame and an adhesive between the pellicle frame and the photomask;
    securing the pellicle frame in a force-transmitting manner against the flow;
    soften at least a portion of the adhesive; and
    leveraging the pellicle frame to remove the adhesive and the pellicle frame away from the photomask.

12. The method of claim 11, further comprising cooling the pellicle frame.

13. The method of claim 11, wherein the portion of the adhesive is soften by heating the photomask.

14. The method of claim 11, the portion of the adhesive is soften by generating a temperature difference between the photomask and the pellicle frame, wherein the temperature of the photomask is higher than the temperature of the pellicle frame.

15. The method of claim 11, wherein the pellicle frame is secured by engaging a lift pin of a gripper into the pellicle frame.

16. The method of claim 15, wherein the pellicle frame is leveraged by the lift pin while moving the gripper away from the photomask.

17. The method of claim 11, wherein the provision of the flow and the leveraging of the pellicle frame are implemented simultaneously.

18. A method of removing a pellicle frame from a photomask, comprising:
    cutting a membrane stretched across the pellicle frame to expose a patterned area of the photomask;
    providing a plate to overlap with the pattern area;
    providing a flow from a peripheral of the plate toward the pellicle frame and an adhesive between the pellicle frame and the photomask;
    soften at least a portion of an adhesive between the pellicle frame and the photomask.

19. The method of claim 18, further comprising adjusting the pellicle frame located around the patterned surface of the photomask to face toward a direction along the gravity force.

20. The method of claim 18, wherein the portion of the adhesive is soften by disposing a heater on a surface of the photomask opposite to the patterned area.

* * * * *